US008323523B2

(12) United States Patent
Fang et al.

(10) Patent No.: US 8,323,523 B2
(45) Date of Patent: Dec. 4, 2012

(54) HIGH PRESSURE BEVEL ETCH PROCESS

(75) Inventors: Tong Fang, Palo Alto, CA (US); Yunsang S. Kim, Monte Sereno, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 55 days.

(21) Appl. No.: 13/105,674

(22) Filed: May 11, 2011

(65) Prior Publication Data

US 2011/0275219 A1   Nov. 10, 2011

Related U.S. Application Data

(63) Continuation-in-part of application No. 12/635,846, filed on Dec. 11, 2009, now Pat. No. 8,262,923.

(60) Provisional application No. 61/138,357, filed on Dec. 17, 2008.

(51) Int. Cl.
B44C 1/22 (2006.01)
(52) U.S. Cl. ............... 216/67; 204/298; 252/571
(58) Field of Classification Search .......... None
See application file for complete search history.

(56) References Cited

U.S. PATENT DOCUMENTS

| | | | |
|---|---|---|---|
| 4,325,984 A | 4/1982 | Galfo et al. | |
| 5,438,009 A * | 8/1995 | Yang et al. | 438/253 |
| 6,436,303 B1 | 8/2002 | Kim et al. | |
| 6,837,967 B1 | 1/2005 | Berman et al. | |
| 7,002,175 B1 * | 2/2006 | Singh et al. | 257/25 |
| 7,858,898 B2 | 12/2010 | Bailey, III et al. | |
| 2004/0251518 A1 * | 12/2004 | Preusse et al. | 257/571 |
| 2006/0016459 A1 * | 1/2006 | McFarlane et al. | 134/1.1 |
| 2006/0051967 A1 | 3/2006 | Chang et al. | |
| 2006/0054279 A1 | 3/2006 | Kim et al. | |
| 2007/0068899 A1 | 3/2007 | Yoon | |
| 2007/0068900 A1 | 3/2007 | Kim et al. | |
| 2007/0228008 A1 | 10/2007 | Wolfe et al. | |
| 2008/0050923 A1 | 2/2008 | Kim et al. | |
| 2008/0083703 A1 | 4/2008 | Suzuki et al. | |
| 2008/0156772 A1 | 7/2008 | Kim et al. | |
| 2008/0179010 A1 | 7/2008 | Bailey, III et al. | |

(Continued)

FOREIGN PATENT DOCUMENTS

WO   WO 00/59025   10/2000

OTHER PUBLICATIONS

Jeon et al, Cleaning of wafer edge, bevel and back-side with a torus-shaped capacitively coupled plasma, Nov. 6, 2002; Plasma Sources Science and Technology, p. 520-524.* International Search Report and Written Opinion mailed Jul. 13, 2010 for PCT/US2009/006531. Corresponding U.S. Appl. No. 61/138,357, filed Dec. 17, 2008.

*Primary Examiner* — Binh X Tran
*Assistant Examiner* — David Cathey, Jr.
(74) *Attorney, Agent, or Firm* — Beyer Law Group LLP (57) ABSTRACT

A method of bevel edge processing a semiconductor in a bevel plasma processing chamber in which the semiconductor substrate is supported on a semiconductor substrate support is provided. The method comprises evacuating the bevel etcher to a pressure of 3 to 100 Torr and maintaining RF voltage under a threshold value; flowing a process gas into the bevel plasma processing chamber; energizing the process gas into a plasma at a periphery of the semiconductor substrate; and bevel processing the semiconductor substrate with the plasma.

18 Claims, 5 Drawing Sheets

U.S. PATENT DOCUMENTS

| | | |
|---|---|---|
| 2008/0179297 A1 | 7/2008 | Bailey, III et al. |
| 2008/0182412 A1 | 7/2008 | Bailey, III et al. |
| 2008/0190448 A1 | 8/2008 | Kim et al. |
| 2008/0216864 A1 | 9/2008 | Sexton et al. |
| 2008/0227301 A1 | 9/2008 | Fang et al. |
| 2009/0170334 A1 | 7/2009 | Fang et al. |
| 2009/0188627 A1 | 7/2009 | Fang et al. |
| 2010/0151686 A1 | 6/2010 | Fang et al. |

* cited by examiner

HIGH PRESSURE BEVEL ETCH PROCESS

CROSS-REFERENCE TO RELATED APPLICATIONS

This application is a continuation in part and claims priority under 35 U.S.C. §120 to U.S. application Ser. No. 12/635,846 entitled HIGH PRESSURE BEVEL ETCH PROCESS, filed Dec. 11, 2009 now issued U.S. Pat. No. 8,262,923, which claims priority under 35 U.S.C. §119 to U.S. Provisional Application No. 61/138,357 entitled HIGH PRESSURE BEVEL ETCH PROCESS, filed Dec. 17, 2008, the entire content of which both references are hereby incorporated by reference.

SUMMARY OF THE INVENTION

Disclosed herein is a method of bevel edge processing a semiconductor in a bevel plasma processing chamber in which the semiconductor substrate is supported on a semiconductor substrate support. The method comprises evacuating the bevel etcher to a pressure of 3 to 100 Torr and maintaining RF voltage; flowing a process gas into the bevel plasma processing chamber; energizing the process gas into a plasma at a periphery of the semiconductor substrate; and bevel processing the semiconductor substrate with the plasma.

In another manifestation of the invention, a method for processing a semiconductor wafer with a stack with at least one layer comprising aluminum on a bevel of the wafer is provided. The wafer is placed in a bevel edge processing chamber. A bevel edge processing chamber is provided with a pressure of between 3 to 100 Torr. The at least one layer comprising aluminum is etched around the bevel of the wafer, comprising flowing an aluminum etching gas comprising a chlorine containing component into a bevel edge processing chamber, forming the aluminum etching gas into a plasma, which etches the at least one layer of the stack comprising aluminum, and stopping the flow of the aluminum etching gas, after the at least one layer comprising aluminum is etched. Part of the at least one layer comprising aluminum is passivated after stopping the flow of the aluminum etching gas, comprising flowing an aluminum passivation gas comprising a fluorine containing component into the bevel edge processing chamber, forming the passivation gas into a plasma, which passivates exposed parts of the at least one layer comprising aluminum while maintaining a pressure of 3 to 100 Torr, and stopping the flow of the passivation gas.

DETAILED DESCRIPTION

Bevel clean modules (bevel etchers), for example, the 2300 CORONUS™ product manufactured by Lam Research Corporation, Fremont, Calif., remove films on the edge of a wafer using edge confined plasma technology. For 65 nm technologies and below, a primary source of device yield limiters are coming from defects transferred from the wafer edge. During device patterning, complex interactions of film deposition, lithography, etching and chemical mechanical polishing result in a wide range of unstable film stacks on the wafer edge. In subsequent steps, these film layers can produce defects that are transported to the device area of the wafer. Removal of these films at select points in the integration flow results in reduced defects and higher device yields. Accordingly, edge confined plasma provides control of the wafer edge buildup at multiple steps during the device fabrication process.

Bevel etched wafers can exhibit macro-arcing, micro-arcing, surface charge and discharge problems on sensitive Back-End-Of-Line (BEOL) wafers. RF voltage at the wafer has been found to correlate with arcing probabilities. As disclosed herein, RF voltage (measured by a VCI probe) seen at the wafer can be reduced for a given electrode power setting by increasing the pressure in the plasma chamber. Thus, at higher pressure regimes, it is possible to widen the process window in terms of power setting and gas chemistry while avoiding the arcing problem. The RF voltage is preferably maintained below a threshold value which depends on the device structure or wafer sensitivity to arcing.

Plasma processing in a bevel etcher 200, for example, to remove bevel edge build-up from a semiconductor substrate can comprise etching the bevel edge with a fluorine-containing plasma. The semiconductor substrate may comprise, for example, a wafer made with a copper Back-End-Of-the-Line (BEOL) damascene process. The semiconductor substrate may have a diameter of about 300 mm. The semiconductor substrate may comprise a bevel edge portion (e.g., up to about two mm wide) that surrounds multilayer integrated circuit (IC) device structures containing exposed copper inwardly of the bevel edge. The exposed copper surfaces may comprise copper surfaces on tantalum-containing seed layers across the wafer.

Figure 1:
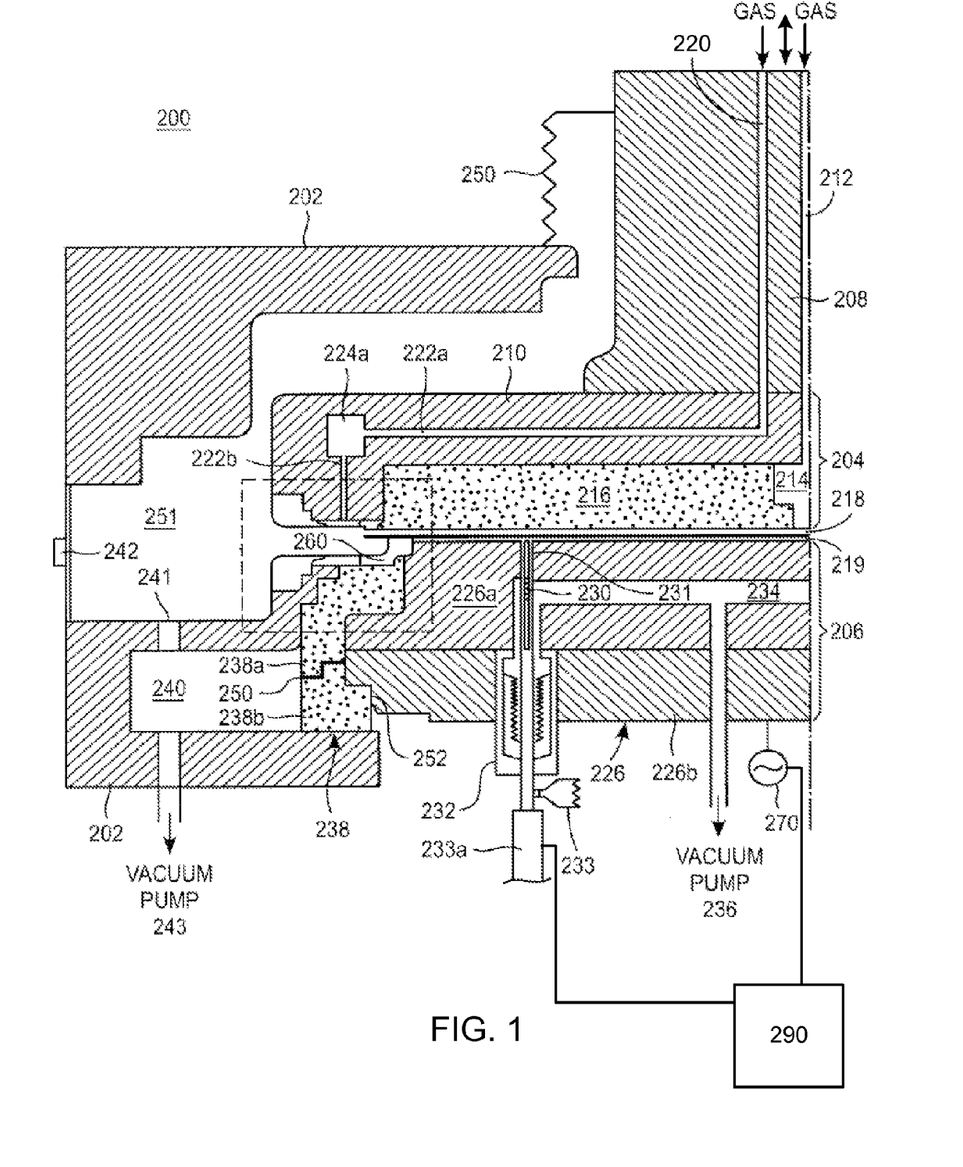
FIG. 1 is a schematic cross sectional diagram of a bevel etcher in accordance with an embodiment.

Referring now to FIG. 1, there is shown a schematic cross sectional diagram of a substrate etching system or bevel etcher 200 for cleaning the bevel edge of a substrate 218 in accordance with one embodiment, as disclosed in commonly assigned U.S. Patent Application Pub. No. 2008/0182412, the disclosure of which is hereby incorporated by reference.

The bevel etcher 200 has a generally, but not limited to, axisymmetric shape and, for brevity, only half of the side cross sectional view is shown in FIG. 1. As depicted, the bevel etcher 200 includes: a chamber wall 202 having a door or gate 242 through which the substrate 218 is loaded/unloaded; an upper electrode assembly 204; a support 208 from which the upper electrode assembly 204 is suspended; and a lower electrode assembly 206. A precision driving mechanism (not shown in FIG. 1) is attached to the support 208 for moving upper electrode assembly 204 up and down (in the direction of the double arrow) so that the gap between the upper electrode assembly 204 and the substrate 218 is controlled accurately.

Metal bellows 250 are used to form a vacuum seal between the chamber wall 202 and support 208 while allowing the support 208 to have a vertical motion relative to the chamber wall 202. The support 208 has a center gas feed (passage) 212 and an edge gas feed (passage) 220. One or both gas feeds 212, 220 can deliver process gas to be energized into plasma to clean the bevel edge. During operation, the plasma is formed around the bevel edge of the substrate 218 and has a generally ring shape. To prevent the plasma from reaching the central portion of the substrate 218, the space between an insulator plate 216 on the upper electrode assembly 204 and the substrate 218 is small and the process gas is fed from the center feed, in an embodiment through a stepped hole 214. Then, the gas passes through the gap between the upper electrode assembly 204 and the substrate 218 in the radial direction of the substrate. Each gas feed is used to provide the same process gas or other gases, such as purge gas. For instance, the purge gas can be injected through the center gas feed 212, while the process gas can be injected through the edge gas feed 220. The plasma/process gas is withdrawn from the chamber space 251 to the bottom space 240 via a plurality of holes (outlets) 241, e.g., a vacuum pump 243 can be used to evacuate the bottom space 240 during a cleaning operation. During a bevel cleaning operation, the chamber pressure is maintained at a pressure of 3 to 100 Torr (e.g., 3 to 5 Torr, 5 to 10 Torr, 10 to 50 Torr or 50 to 100 Torr). Such pressure is higher than the exemplary pressures disclosed in commonly assigned U.S. Patent Publication Nos. 2008/0227301, 2008/0050923, 2008/0156772 and 2008/0190448, the disclosures of which are hereby incorporated by reference.

The process gas can comprise an oxygen-containing gas, such as $O_2$, $N_2O$, CO, COS and/or $CO_2$. Fluorine-containing gas, such as, for example, $SF_6$, $NF_3$, $C_xF_y$ (e.g., $CF_4$, $C_2F_4$, $C_2F_6$), $C_xF_yH_2$ (e.g., $C_3HF$, $CHF_3$, $CH_2F_2$, $C_2H_2F_4$), can also be added to the process gas. The amount of fluorine-containing gas in the process gas can depend on the specific film(s) being removed by bevel (edge) etching. For example, small amounts, such as <10% by volume, or large amounts, such as >80% or >90% by volume, of fluorine-containing gas can be present in the process gas. In different embodiments, the process gas can comprise, for example, about 5% by volume $NF_3$/balance $CO_2$ or about 10% by volume $CF_4$/balance $CO_2$.

The upper electrode assembly 204 includes: an upper dielectric plate or upper dielectric component 216; and an upper metal component 210 secured to the support 208 by a suitable fastening mechanism and grounded via the support 208. The upper metal component 210 is formed of a metal, such as aluminum, and may be anodized. The upper metal component 210 has one or more edge gas passageways or through holes 222a, 222b and an edge gas plenum 224a, wherein the edge gas passageways or through holes 222a, 222b are coupled to the edge gas feed 220 for fluid communication during operation. The upper dielectric plate 216 is attached to the upper metal component 210 and formed of a dielectric material, for example, ceramic. If desired, the upper dielectric plate 216 may have a coating of $Y_2O_3$. Bulk $Y_2O_3$ or $Y_2O_3$ coated parts and ceramics such as SiC, SiN, Si, AlN and the like are preferred over alumina or anodized aluminum parts due to their ability to dissipate charges on the wafer and thus reduce the probability of arcing as indicated by lower RF voltage measurements. Typically, it is difficult to drill a deep straight hole in some ceramics, such as $Al_2O_3$, and therefore a stepped hole 214 can be used instead of a deep straight hole. While the upper dielectric plate 216 is shown with a single center hole, the upper dielectric plate 216 may have any suitable number of outlets, e.g., the outlets can be arranged in a showerhead hole pattern if desired.

The lower electrode assembly 206 includes: powered electrode 226 having an upper portion 226a and a lower portion 226b and optionally operative to function as a vacuum chuck to hold the substrate 218 in place during operation; lift pins 230 for moving the substrate 218 up and down; a pin operating unit 232; bottom dielectric ring 238 having an upper portion 238a and a lower portion 238b. In an embodiment, the chuck can be an electrostatic chuck. Hereinafter, the term powered electrode refers to one or both of the upper and lower portions 226a, 226b. Likewise, the term bottom dielectric ring 238 refers to one or both of the upper and lower portions 238a, 238b. The powered electrode 226 is coupled to a radio frequency (RF) power source 270 to receive RF power during operation.

The lift pins 230 move vertically within cylindrical holes or paths 231 and are moved between upper and lower positions by the pin operating unit 232 positioned in the powered electrode 226. The pin operating unit 232 includes a housing around each lift pin to maintain a vacuum sealed environment around the pins. The pin operating unit 232 includes any suitable lift pin mechanism, such as a robot arm 233 (e.g., a horizontal arm having segments extending into each housing and attached to each pin) and an arm actuating device (not shown in FIG. 1) and with a pin guide assembly 233a. For brevity, only a tip portion of a segment of the robot arm is shown in FIG. 1. While three or four lift pins can be used to lift a wafer, such as, for example, a 300 mm wafer, any suitable number of lift pins 230 may be used in the bevel etcher 200. Also, any suitable mechanisms, such as lifter bellows, can be used as the pin operating unit 232.

The substrate 218 is mounted on the lower electrode or on a lower configurable plasma-exclusion-zone (PEZ) ring 260, wherein the term PEZ refers to a radial distance from the center of the substrate to the outer edge of the area where the plasma for cleaning the bevel edge is to be excluded. The ring 260 is preferably a dielectric material. Bulk $Y_2O_3$ or $Y_2O_3$ coated parts and ceramics such as SiC, SiN, Si, AlN and the like are preferred over alumina or anodized aluminum parts due to their ability to dissipate charges on the wafer and thus reduce the probability of arcing as indicated by lower RF voltage measurements. In an embodiment, the top surface of the powered electrode 226, the bottom surface of the substrate 218, and inner periphery of the lower configurable PEZ ring 260 can form an enclosed vacuum region recess (vacuum region) 219 in fluid communication with a vacuum source such as a vacuum pump 236. The cylindrical holes or paths for the lift pins 230 are also shared as gas passageways, through which the vacuum pump 236 evacuates the vacuum region 219 during operation. The powered electrode 226a, 226b includes a plenum 234 to reduce temporal pressure fluctuations in the vacuum region 219 and, in cases where multiple lift pins are used, to provide a uniform suction rate for the cylindrical holes.

On the top surface of the substrate 218 are integrated circuits, which can contain exposed copper surfaces which may be on tantalum-containing seed layers, formed by a series of processes. One or more of the processes may be performed by use of plasma that may transfer heat energy to the substrate, developing thermal stress on the substrate and thereby causing wafer bowing. During a bevel cleaning operation, the substrate bowing can be reduced by use of a pressure difference between the top and bottom surfaces of the substrate 218. The pressure in the vacuum region 219 is maintained under vacuum during operation by a vacuum pump 236 coupled to the plenum 234. By adjusting the gap between the upper dielectric plate 216 and the top surface of the substrate 218, the gas pressure in the gap can be varied without changing the overall flow rate of the process gas(es). Thus, by controlling the gas pressure in the gap, the pressure difference between the top and bottom surfaces of the substrate 218 can be varied and thereby the bending force applied on the substrate 218 can be controlled.

The bottom dielectric ring 238a, 238b is formed of a dielectric material, such as ceramic including $Al_2O_3$, $Y_2O_3$ or the like and electrically separates the powered electrode 226 from the chamber wall 202. Bulk $Y_2O_3$ or $Y_2O_3$ coated parts and ceramics such as SiC, SiN, Si, AlN and the like are preferred over alumina or anodized aluminum parts due to their ability to dissipate charges on the wafer and thus reduce the probability of arcing as indicated by lower RF voltage measurements. The lower portion 238b of the bottom dielectric ring in an embodiment has a step 252 formed on the inner periphery of its upper surface to mate with a recess on a lower edge of the powered electrode 226. The lower portion 238b in an embodiment has a step 250 formed on its outer periphery to mate with a stepped surface on the upper portion 238a of the bottom dielectric ring, referred to as a focus ring. The steps 250, 252 align the bottom dielectric ring 238 with the powered electrode 226. The step 250 also forms a tortuous gap along the surface thereof to eliminate the direct line-of-sight between the powered electrode 226 and the chamber wall 202 thereby reducing the possibility of a secondary plasma strike between the powered electrode 226 and the chamber wall 202.

The bevel edge cleaning plasma processing can comprise feeding a gas mixture including, for example, $NF_3$ or $CF_4$ into the bevel etcher and energizing the gas mixture into a plasma state. In particular, the gas mixture may comprise $NF_3$ and $CO_2$ or $CF_4$ and $CO_2$. For example, the gas mixture may comprise about 5% by volume $NF_3$/balance $CO_2$ or about 10% by volume $CF_4$/balance $CO_2$. The gas mixture may be fed into the bevel etcher at a periphery and/or at the center of the semiconductor substrate. For example, when the fluorine-containing gas mixture is fed into the bevel etcher at a periphery of the semiconductor substrate, $N_2$ gas may be fed into the bevel etcher at a center of the semiconductor substrate.

Bevel etching can result in arcing in the outer periphery of the wafer leading to loss of yield of devices being manufactured. Such yield losses can exceed 3% of the wafer yield. Thus, eliminating arcing in the outer region of the bevel edge cleaned wafer is desirable in order to improve yield of devices on the processed wafer.

In an embodiment, conditions for processing of the semiconductor substrate with the plasma include an exposure time of greater than about 5 seconds, for example, about 30 seconds, and an RF power of greater than about 50 Watts, for example, 50 to 2000 Watts. In an embodiment, higher RF power at 2 to 60 $MH_z$, generates plasma from process gas flowed into the chamber at 5 to 3000 sccm.

Figure 2:
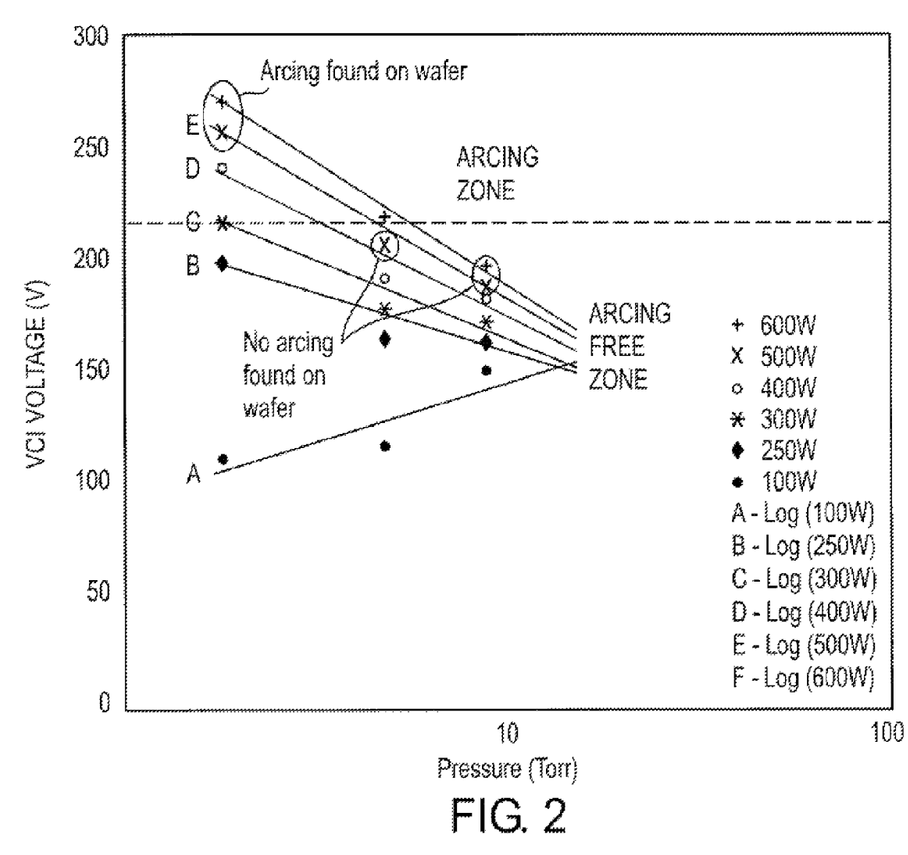
FIG. 2 is a graph showing arcing-free process conditions based on VCI voltage measurements.

FIG. 2 is a graph showing VCI voltage measured by a VCI probe connected to the RF feed to the bottom electrode supporting a test wafer bevel etched with process gas of 10 sccm $NF_3$, 200 sccm $CO_2$ and 500 sccm $N_2$. As can be seen in FIG. 2, at low pressures of $\leq 2$ Torr arcing occurred at power levels of 500 Watts and 600 Watts. The arcing problem was not observed when the chamber pressure was increased to 5 Torr and 9 Torr for those same power settings. An arcing free process window appears to lie within a chamber pressure of at least 3 Torr while maintaining RF voltage seen at the wafer at a low enough value to avoid arcing. The threshold value will depend on the device structure and wafer sensitivity to arcing. In a preferred embodiment, the RF voltage measured by a VCI probe monitoring wafer voltage is no greater than about 220 volts. The elimination of arcing at the elevated chamber pressure was unexpected and implementation of a high pressure bevel edge cleaning process can be expected to provide substantial increases in yield of semiconductor devices undergoing further processing steps on the bevel cleaned wafer.

Figure 3:
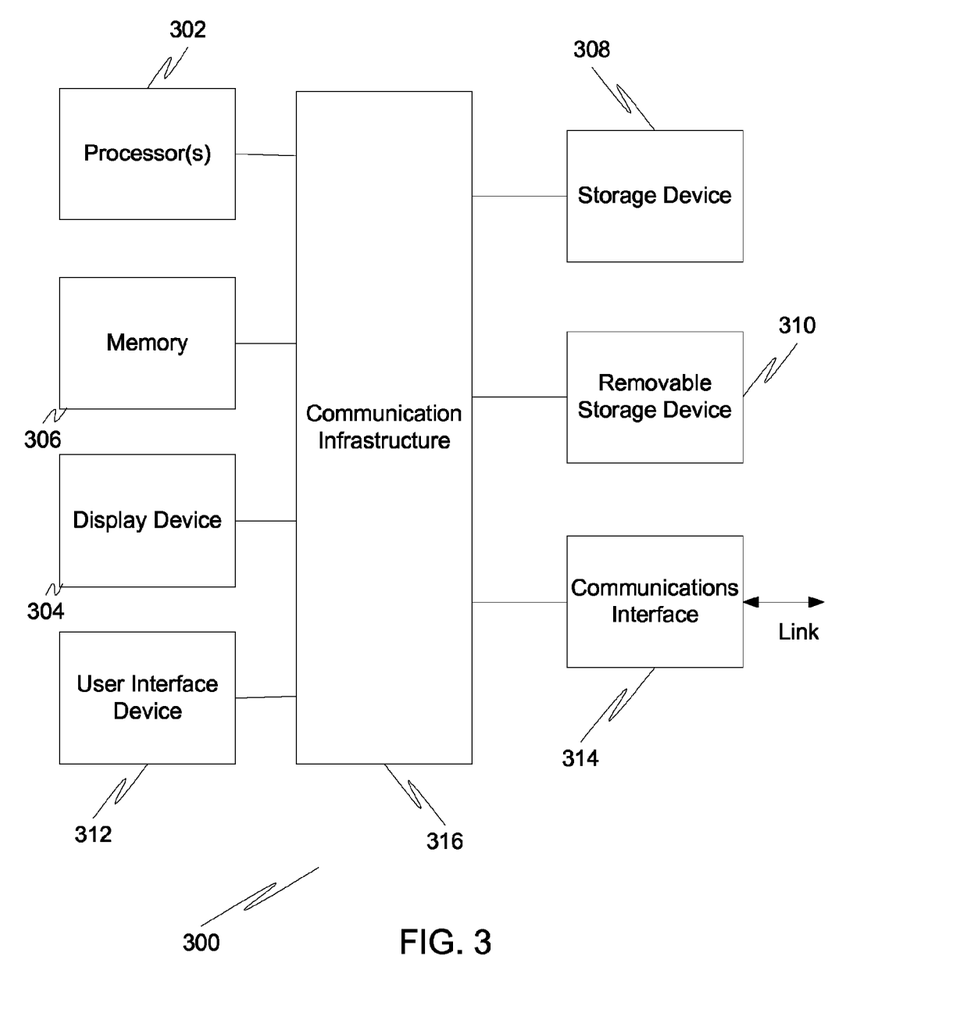
FIG. 3 illustrates a computer system 300, which is suitable for implementing a controller 290 used in embodiments of the present invention.

The bevel etcher 200 is controlled by a controller 290. FIG. 3 is a high level block diagram showing a computer system 300, which is suitable for implementing a controller 290 used in embodiments of the present invention. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communication interface 314 (e.g., wireless network interface). The communication interface 314 allows software and data to be transferred between the computer system 300 and external devices via a link. The system may also include a communications infrastructure 316 (e.g., a communications bus, crossover bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Metal Layer Etching and Passivation

Figure 4:
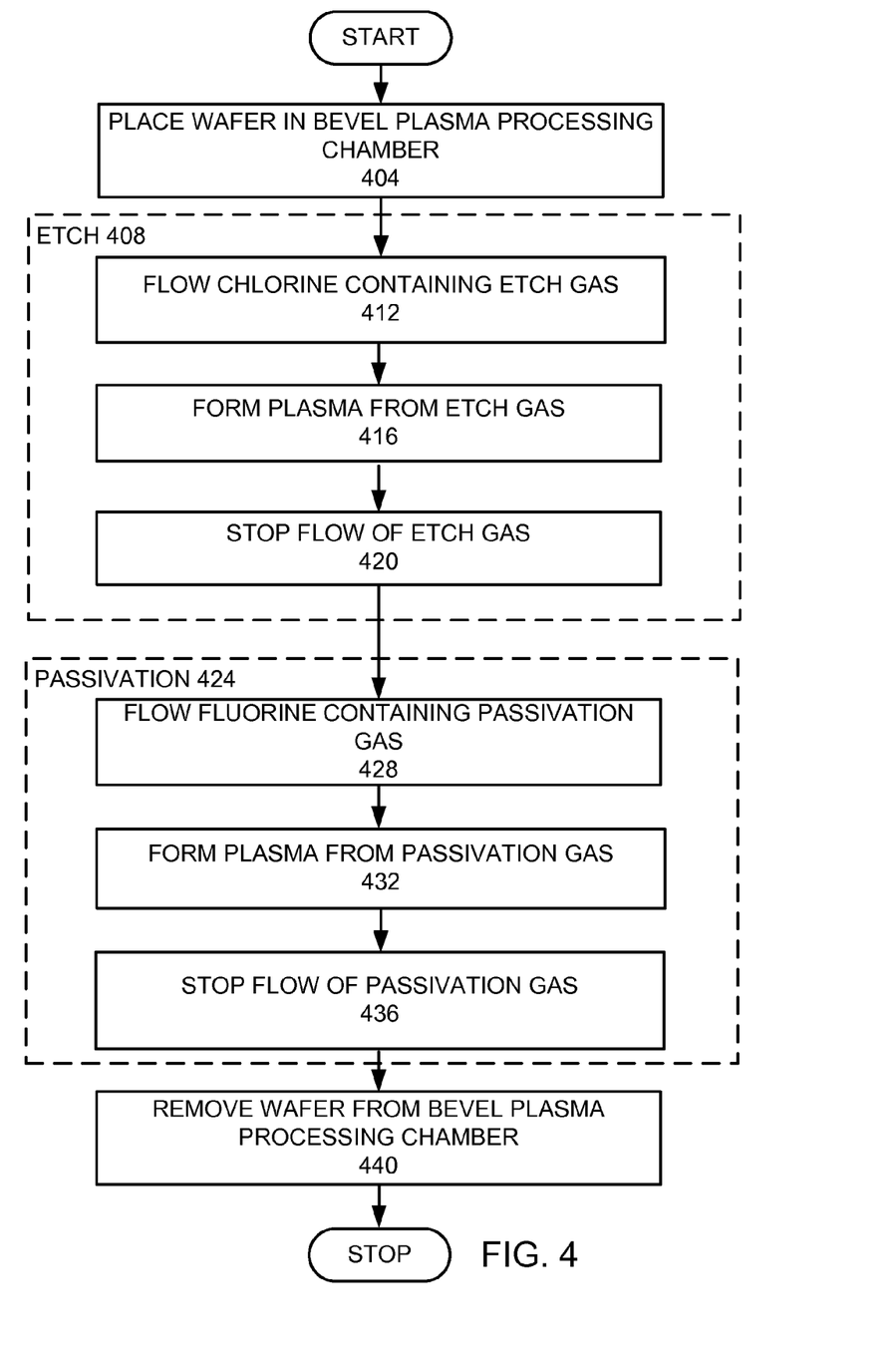
FIG. 4 is a flow chart of an embodiment of the invention that provides metal etching and passivation.

FIG. 4 is a flow chart of an embodiment of the invention that provides metal etching and passivation. A wafer is placed in a bevel plasma processing chamber (step 404). The bevel plasma processing chamber may be the same as the bevel etcher 200 in FIG. 2. In this embodiment, the bevel etcher 200 is used in other bevel plasma processing in addition to etching, such as passivation. In this example, the upper dielectric plate 216 is placed 0.35 mm from the upper surface of the wafer. In various embodiments, the dielectric plate is placed in the range from 0.30 mm to 0.65 mm from the upper surface of the wafer.

Figure 5:
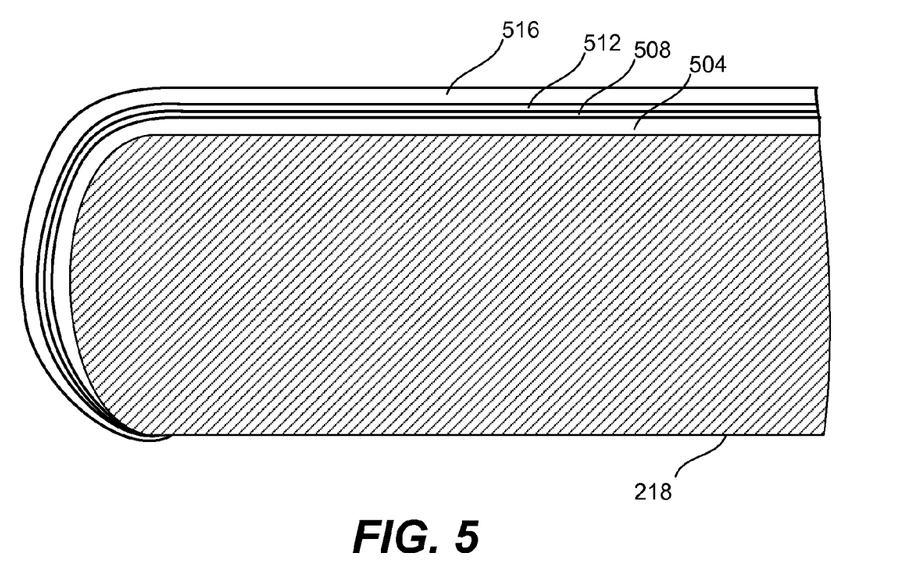
FIG. 5 is a schematic illustration of an enlarged cross-sectional view of part of a substrate wafer over which a stack is formed.

FIG. 5 is a schematic illustration of an enlarged cross-sectional view of part of a substrate wafer 218 over which a stack is formed. The illustration is not to scale in order to be able to more clearly illustrate various layers in the stack. The stack may be a result of various processes performed on the wafer in forming semiconductor devices, which may, as a side effect, form different layers on the wafer bevel. In this embodiment, the stack comprises an undoped glass (silicon oxide) USG layer 504 over the wafer 218, a tantalum nitride TaN layer 508 over the USG layer 504, a titanium nitride TiN layer 512 over the TaN layer 508, and an aluminum Al layer 516 over that TiN layer 512. Other different layer configurations may be used in other embodiments and additional layers may be formed between the described layers in the stack. For example, the stacks could contain Al, TiN, TaN, TiAlN, TiAl, AlTi, AlTiO for High-K Metal Gate applications. Other embodiments are applicable for Al, TiN, TaN, TiAl, TiAlN, and other metallic films, such as W etc.

The part of the stack over the wafer bevel is etched (step 408). A chlorine containing etch gas is flowed into the bevel plasma processing chamber (step 412). Preferably, the chlorine containing etch gas comprises $BCl_3$ and $Cl_2$. The etch gas is formed into a plasma (step 416). The plasma is extinguished. The flow of the etch gas is then stopped (step 420). An example of a specific recipe for etching the stack, where at least one layer of the stack is aluminum or its alloy, provides an etch gas of 90 sccm $Cl_2$, 90 sccm $BCl_3$, and 500 sccm $N_2$. Preferably, the $Cl_2$ and $BCl_3$ are provided directly to the periphery of the wafer near the wafer bevel, while the $N_2$ is provided to the center of the wafer. To form the plasma, a pressure of 5 Torr and a temperature of 60° C. are maintained, and 600 Watts at 13.6 MHz RF power is provided for 30 to 90 seconds before the flow of the etch gas is stopped. The plasma may be extinguished before the flow of the etch gas is stopped.

Before this etch was found to be successful, the Al alloy removal on bevel was mostly achieved by Wet Chemical Process, which is currently commercially available and widely adopted by semiconductor manufactures. This invention uses a dry bevel plasma approach for aluminum alloy removal at the bevel, which provides a more efficient and effective method than all the other alternative approaches. The inventors believed that it was not possible to etch aluminum at room temperature in a bevel plasma processing chamber, before the inventive method was found to work. Therefore, finding that the chemistry $Cl_2/BCl_3$ with $N_2$ or Ar or He; with or without fluorine gases may be used to successfully etch aluminum in a bevel processing chamber was an unexpected result. It is preferred that a pressure from 100 mT to 100 Torr is provided to the chamber. A power from 100 Watts to 800 Watts of RF is provided. A total gas flow from 200 to 1000 sccm is provided for a process time of 10 sec to 300 sec. A chuck temp 15° C. to 100° C. is maintained.

In addition, it was unexpectedly found that an etch at room temperature, 20° C., resulted in increased corrosion. It was unexpectedly found that by increasing the temperature at which the etch is performed, preferably at least 40° C., more preferably at least 55° C., most preferably at least 60° C., corrosion is reduced or eliminated.

Figure 6:
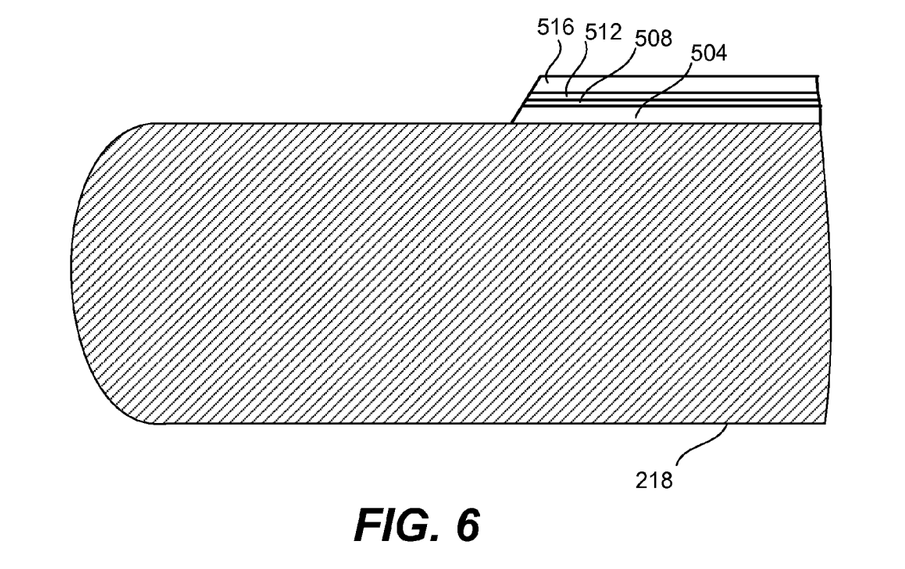
FIG. 6 is a schematic illustration of the enlarged cross-sectional view of part of a substrate wafer and stack after the etch.

FIG. 6 is a schematic illustration of the enlarged cross-sectional view of part of a substrate wafer 218 and stack after the etch. The stack is removed from the bevel region of the wafer. In this example, the etch bevel area is from the edge of the wafer to 1 to 3 mm from the edge of the wafer. The etch creates an exposed surface of the aluminum layer 516 on the side of the aluminum layer. The exposed surface on the side of the aluminum layer at the removal boundary is subject to corrosion. The top surface of the aluminum may not be subjected to corrosion, because it is believed that a native aluminum oxide layer is formed on the top surface of the aluminum layer, which prevents corrosion. It is believed that the exposed surface has not formed a sufficient aluminum oxide layer to prevent corrosion.

Various detection methods such as, using the VisEdge™ tool by KLA-Tencor™, an XSEM (Cross section SEM), a top down SEM (scanning electron microscope), and EDX (energy-dispersive x-ray spectroscopy) were used to determine the amount of aluminum corrosion occurs on the exposed surface without passivation. A significant amount of corrosion was found.

To prevent corrosion, a passivation step is performed (step 424). In the passivation step, a fluorine containing passivation gas is flowed into the bevel plasma processing chamber (step 428). Preferably, the passivation gas comprises $CF_4$ and at least one of $SF_6$ or $NF_3$. The passivation gas is formed into a plasma (step 432). The flow of the passivation gas is stopped (step 436). The plasma may be extinguished before the flow of the passivation gas is stopped. An example of a specific recipe for passivating the stack provides a passivating gas of 20 sccm $SF_6$, 90 sccm $CF_4$, and 500 sccm $N_2$. Preferably, the $SF_6$ and $CF_4$ are provided by gas outlets near the periphery of the wafer, and the $N_2$ is provided near the center of the wafer to etch TiN and TaN and to mitigate q-time defects, which are time dependent defects caused by reactions with moisture in the ambient. To form the plasma, a pressure of 5 Torr and a temperature of 60° C. are maintained, and 400 Watts at of 13.6 MHz RF power is provided for 30 to 90 seconds before the flow of the passivation gas is stopped. The wafer is then removed from the bevel plasma processing chamber (step 440).

To find a recipe that provides passivation in a bevel plasma processing chamber, various experiments of various chemistries, temperatures, pressures, and powers, using plasma and non plasma processes, using purge and non purge processes were performed, where a wet box was used to accelerate corrosion. The passivation recipe was unexpectedly found to work by preventing corrosion after a metal layer, such as aluminum or its alloy, bevel etch. Being able to provide in-situ passivation using a bevel plasma processing chamber reduces corrosion and reduces the number of tools needed for processing the wafer. It was unexpectedly found that a high pressure greater than 3 Torr and a high temperature of greater than 40° C. reduced corrosion and improved passivation. It was further found that a pressure of at least 5 Torr and a temperature of 55° C. further reduced corrosion and improved passivation. It was further found that a temperature of at least 60° C. even further reduced corrosion and improved passivation. The above example allows the etch and passivation to be performed at the same temperature and in the same chamber which allows for faster throughput.

It should be noted that when a layer is specified as comprising aluminum, it means that the layer is aluminum or an aluminum alloy.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of bevel edge processing a semiconductor substrate with a plasma in a bevel edge processing chamber in which the semiconductor substrate is supported on a semiconductor substrate support, comprising: supplying process gas to the bevel edge processing chamber and energizing the process gas into a plasma;

bevel edge processing the semiconductor substrate with the plasma in the bevel edge processing chamber while evacuating the bevel edge processing chamber to a pressure of 3 to 100 Torr, without arcing in an outer bevel edge region of the semiconductor substrate, while preventing the plasma from reaching the center portion of the substrate, and while monitoring wafer voltage using a VCI probe and maintaining RF voltage measured by the VCI probe below a threshold voltage value.

2. The method of claim 1, wherein the bevel edge process comprises:
flowing a processing gas comprising $CF_4$ and at least one of $SF_6$ or $NF_3$ into the bevel edge processing chamber;
forming the processing gas into a plasma; and
stopping the flow of the processing gas.

3. The method of claim 1, wherein the bevel edge processing, comprises providing a stack etch on the bevel edge, wherein at least one layer of the stack comprises aluminum, comprising:
flowing an aluminum etching gas comprising a chlorine containing component into a bevel edge processing chamber;
forming the aluminum etching gas into a plasma, which etches the at least one layer of the stack comprising aluminum; and
stopping the flow of the aluminum etching gas, after the at least one layer comprising aluminum is etched.

4. The method of claim 3, wherein the bevel edge processing further comprises:
flowing an aluminum passivation gas comprising a fluorine containing component into a bevel edge processing chamber after stopping the flow of the aluminum etching gas;
forming the passivation gas into a plasma, which passivates exposed parts of the at least one layer comprising aluminum while maintaining a pressure of 3 to 100 Torr; and
stopping the flow of the passivation gas.

5. The method of claim 4, wherein the aluminum passivation gas comprises $CF_4$ and at least one of $SF_6$ or $NF_3$.

6. The method of claim 5, wherein the aluminum etching gas comprises $BCl_3$ and $Cl_2$.

7. The method of claim 6, wherein the bevel edge processing further comprises providing a chamber temperature of greater than 40° C.

8. The method of claim 6, wherein the bevel edge processing further comprises providing a chamber temperature of at least 55° C.

9. The method of claim 8, wherein the stack further comprises at least one layer of TiN, at least one layer of TaN, and at least one siliconoxide layer.

10. The method of claim 3, wherein the bevel edge processing further comprises providing a chamber temperature of at least 55° C.

11. The method of claim 3, wherein the aluminum etching gas comprises $BCl_3$ and $Cl_2$.

12. The method of claim 11, wherein the bevel edge processing further comprises providing a chamber temperature of greater than 40° C.

13. The method of claim 1, wherein the bevel edge processing comprises:
flowing an aluminum passivation gas comprising a fluorine containing component into a bevel edge processing chamber after stopping the flow of the aluminum etching gas;
forming the passivation gas into a plasma, which passivates exposed parts of the aluminum while maintaining a pressure of 3 to 100 Torr; and
stopping the flow of the passivation gas.

14. A method for processing a semiconductor wafer with a stack with at least one layer comprising aluminum on a bevel of the wafer, comprising:
placing the wafer in a bevel edge processing chamber;
supplying process gas to the bevel edge processing chamber and energizing the process gas into a plasma;
providing a bevel edge processing chamber pressure of between 3 to 100 Torr, without arcing in an outer bevel edge region of the semiconductor substrate, while preventing the plasma from reaching the center portion of the substrate, and while monitoring wafer voltage using a VCI probe and maintaining RF voltage measured by the VCI probe below a threshold voltage value;
etching the at least one layer comprising aluminum around the bevel of the wafer, comprising:
flowing an aluminum etching gas comprising a chlorine containing component into a bevel edge processing chamber;
forming the aluminum etching gas into a plasma, which etches the at least one layer of the stack comprising aluminum; and
stopping the flow of the aluminum etching gas, after the at least one layer comprising aluminum is etched; and
passivating part of the at least one layer comprising aluminum after stopping the flow of the aluminum etching gas, comprising:
flowing an aluminum passivation gas comprising a fluorine containing component into the bevel edge processing chamber;
forming the passivation gas into a plasma, which passivates exposed parts of the at least one layer comprising aluminum while maintaining a pressure of 3 to 100 Torr; and
stopping the flow of the passivation gas.

15. The method of claim 14, wherein the aluminum passivation gas comprises $CF_4$ and at least one of $SF_6$ or $NF_3$.

16. The method of claim 15, wherein the aluminum etching gas comprises $BCl_3$ and $Cl_2$.

17. The method of claim 16, wherein the bevel edge processing further comprises providing a chamber temperature of greater than 40° C.

18. The method of claim 17, wherein the bevel edge processing further comprises providing a chamber temperature of at least 55° C.

* * * * *